US012631954B2

(12) United States Patent
Lee et al.

(10) Patent No.: US 12,631,954 B2
(45) Date of Patent: May 19, 2026

(54) OPTICAL PROXIMITY CORRECTION (OPC) METHOD, AND METHODS OF MANUFACTURING MASK USING THE OPC METHOD

(71) Applicant: Samsung Electronics Co., Ltd., Suwon-si (KR)

(72) Inventors: Heejun Lee, Suwon-si (KR); Wooyong Cho, Suwon-si (KR); Bayram Yenikaya, Suwon-si (KR); Joobyoung Kim, Suwon (KR); Useong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 731 days.

(21) Appl. No.: 18/111,785

(22) Filed: Feb. 20, 2023

(65) Prior Publication Data

US 2024/0280891 A1 Aug. 22, 2024

(51) Int. Cl.
*G03F 1/36* (2012.01)
*G03F 1/84* (2012.01)

(52) U.S. Cl.
CPC . *G03F 1/36* (2013.01); *G03F 1/84* (2013.01)

(58) Field of Classification Search
USPC .................................. 716/51, 52, 53, 54, 55
See application file for complete search history.

(56) References Cited

U.S. PATENT DOCUMENTS

| | | | |
|---|---|---|---|
| 8,584,058 B2 | 11/2013 | Futrell et al. | |
| 8,938,699 B2 | 1/2015 | Wong et al. | |
| 10,354,044 B2 | 7/2019 | Word et al. | |
| 10,922,472 B2 | 2/2021 | Kang et al. | |
| 2017/0082927 A1* | 3/2017 | Hsu ..................... | G03F 7/70441 |
| 2017/0184979 A1* | 6/2017 | Hsu .......................... | G03F 1/36 |
| 2021/0063868 A1 | 3/2021 | Bang et al. | |
| 2022/0050376 A1* | 2/2022 | Kang ....................... | G03F 1/24 |
| 2022/0057707 A1 | 2/2022 | Kim et al. | |
| 2024/0119582 A1* | 4/2024 | Zhang ...................... | G03F 1/36 |

* cited by examiner

*Primary Examiner* — Brian Ngo
(74) *Attorney, Agent, or Firm* — Wolf, Greenfield & Sacks, P.C.

(57) ABSTRACT

Provided are an optical proximity correction (OPC) method capable of addressing the limitations of patterning and improving the reliability of patterning, and a mask manufacturing method using the OPC method. In the OPC method, a rectangular mask layout for a target pattern is created, the edge of the rectangular mask layout is dissected into segments, a first shape variable point is created, and a second shape variable point is created by shifting the first shape variable point on a rounded target pattern. Thereafter, a curvilinear mask layout is created based on the second shape variable point, a contour is extracted based on the curvilinear mask layout, an edge placement error (EPE) is determined, and the operations are repeated according to a predetermined criterion, thereby realizing a mask layout with minimal EPEs.

20 Claims, 28 Drawing Sheets

— MLrec

OPTICAL PROXIMITY CORRECTION (OPC) METHOD, AND METHODS OF MANUFACTURING MASK USING THE OPC METHOD

BACKGROUND

The inventive concept relates to a method of manufacturing a mask, and more particularly, to an optical proximity correction (OPC) method and a method of manufacturing a mask by using the OPC method.

In a semiconductor process, photolithography using a mask may be performed to form a pattern on a semiconductor substrate such as a wafer. A mask may be simply defined as a pattern transfer body in which a pattern of an opaque material is formed on a transparent base material. In brief, in a mask manufacturing process, a desired circuit is first planned, the layout of the desired circuit is designed, and then design data obtained through optical proximity correction (OPC) is transmitted as mask tape-out (MTO) design data. Thereafter, mask data preparation (MDP) is performed based on the MTO design data, and an exposure process or the like can be performed on a mask substrate.

SUMMARY

The inventive concept provides an optical proximity correction (OPC) method capable of addressing the limitations of patterning and improving the reliability of patterning, and a mask manufacturing method using the OPC method.

In addition, the problems to be solved by the inventive concept are not limited to the aforementioned problems, and other problems may be clearly understood by those skilled in the art from the following description.

According to some embodiments of the inventive concept, there is provided an OPC method including creating a rectangular mask layout for a target pattern on a wafer, dissecting an edge of the rectangular mask layout into segments, creating a first shape variable point on the edge of the rectangular mask layout, creating a rounded target pattern corresponding to the target pattern, creating a second shape variable point by shifting the first shape variable point on the rounded target pattern, converting the rectangular mask layout into a curvilinear mask layout, based on the second shape variable point, extracting a contour of the rounded target pattern based on the curvilinear mask layout, determining an edge placement error (EPE), which is a difference between the contour and an edge of the rounded target pattern, at a set evaluation point, determining whether the extracting of the contour is to be re-performed, determining a displacement for the second shape variable point when it is determined that the extracting of the contour is to be re-performed, and shifting the second shape variable point by the displacement, and re-performing the converting of the rectangular mask layout into the curvilinear mask layout based on the second shape variable point that has been shifted by the displacement.

According to some embodiments of the inventive concept, there is provided an OPC method comprising creating a rectangular mask layout for a target pattern on a wafer, dissecting an edge of the rectangular mask layout into segments, creating a first shape variable point on the edge of the rectangular mask layout, creating a rounded target pattern inscribed within sides of the rectangular mask layout, creating a second shape variable point by shifting the first shape variable point on the rounded target pattern in a normal direction with respect to the rounded target pattern, and setting the second shape variable point as an evaluation point, converting the rectangular mask layout into a curvilinear mask layout, based on the second shape variable point, extracting a contour of the rounded target pattern based on the curvilinear mask layout, determining an edge placement error (EPE), which is a difference between the contour and an edge of the rounded target pattern, at the evaluation point, determining whether to re-perform the extracting of the contour, based on a set reference value for the EPE or a set reference number of times for the extracting of the contour, when the extracting of the contour is to be re-performed, determining a displacement for the second shape variable point, and shifting the second shape variable point by the displacement, and re-performing the converting of the rectangular mask layout into the curvilinear mask layout based on the second shape variable point that has been shifted by the displacement, and, when the extracting of the contour is not to be re-performed, determining the curvilinear mask layout as a final mask layout.

According to some embodiments of the inventive concept, there is provided a mask manufacturing method including creating a rectangular mask layout for a target pattern on a wafer, dissecting an edge of the rectangular mask layout into segments, creating a first shape variable point on the edge of the rectangular mask layout, creating a rounded target pattern corresponding to the target pattern, creating a second shape variable point by shifting the first shape variable point on the rounded target pattern, and setting the second shape variable point as an evaluation point, converting the rectangular mask layout into a curvilinear mask layout, based on the second shape variable point, extracting a contour of the rounded target pattern based on the curvilinear mask layout, determining an edge placement error (EPE), which is a difference between the contour and an edge of the rounded target pattern, at the evaluation point, determining whether the extracting of the contour is to be re-performed, when the extracting of the contour is not to be re-performed, determining the curvilinear mask layout as an optical proximity corrected (OPCed layout), transmitting data for the OPC layout as Mask Tape-Out (MTO) design data, preparing a mask substrate for mask data, based on the MTO design data, and performing exposure on a mask substrate, based on the mask data, and, when the extracting of the contour is to be re-performed, determining a displacement for the second shape variable point, and shifting the second shape variable point by the displacement, and re-performing the converting of the rectangular mask layout into the curvilinear mask layout based on the second shape variable point that has been shifted by the displacement.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
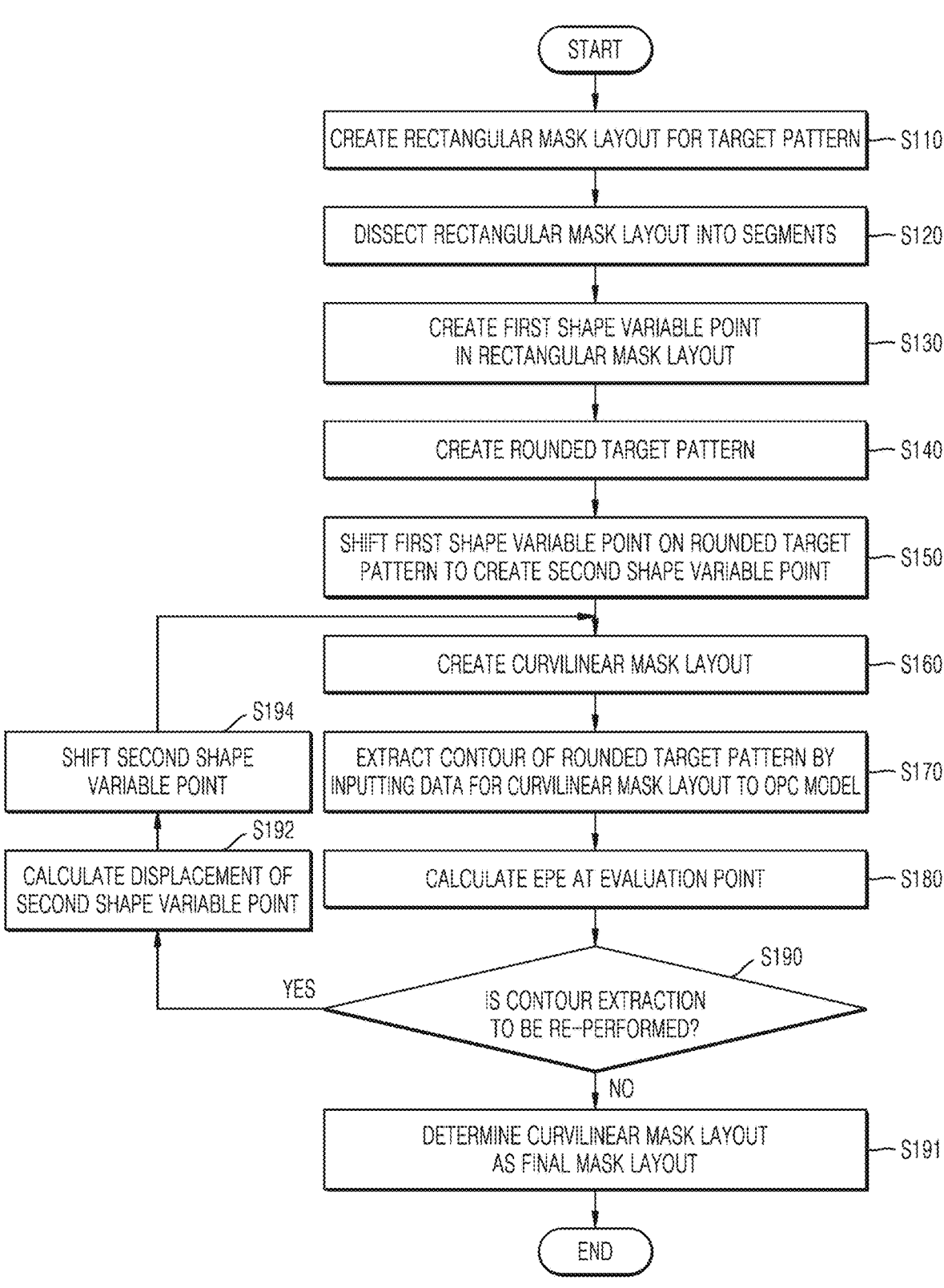
FIG. 1 is a flowchart of an optical proximity correction (OPC) method according to some embodiments.

Embodiments will now be described more fully with reference to the accompanying drawings. In the accompanying drawings, like reference numerals may refer to like elements, and repeated descriptions of the like elements will be omitted.

Figure 2:
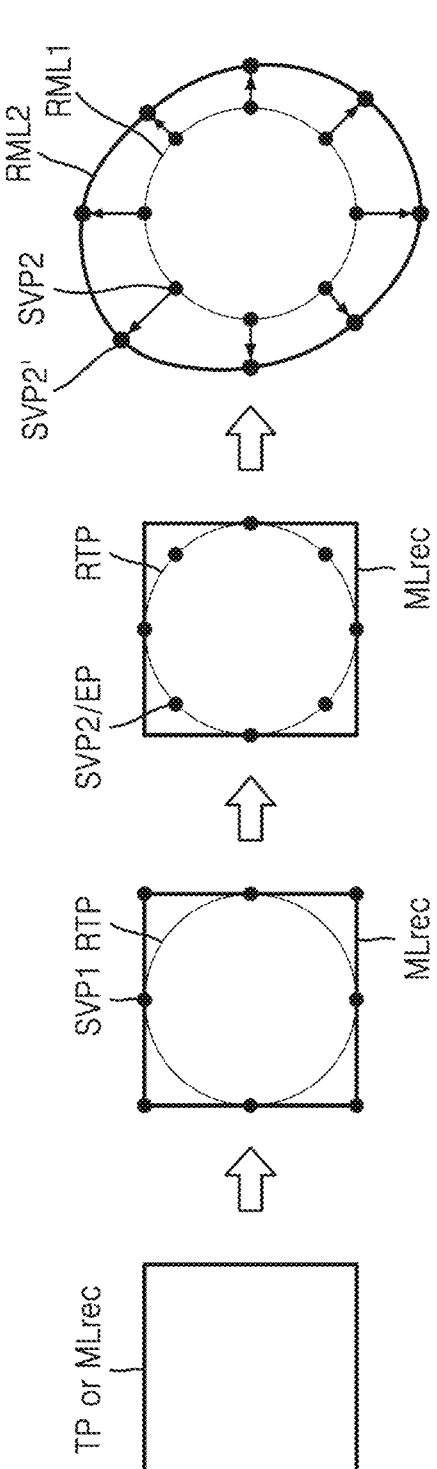
FIG. 2 includes conceptual diagrams schematically showing the OPC method of FIG. 1.

FIG. 1 is a flowchart of a process of an optical proximity correction (OPC) method according to some embodiments, and FIG. 2 is conceptual diagrams schematically showing the OPC method of FIG. 1.

Referring to FIGS. 1 and 2, in the OPC method of some embodiments, first, a rectangular mask layout for a target pattern on a wafer is generated (S110). The target pattern on the wafer may refer to a pattern to be formed on a substrate, such as a wafer, in an exposure process using a mask. In other words, the pattern on the mask may be transferred to the wafer through an exposure process to form a target pattern on the wafer. Because the pattern on the mask is reduced and projected and transferred onto the wafer, the pattern on the mask may have a larger size than the target pattern on the wafer.

A mask layout refers to a layout of the pattern on a mask corresponding to a target pattern. Due to the characteristics of the exposure process, the shape of the target pattern and the shape of the mask layout may generally be different from each other. A mask layout composed of only straight lines perpendicular to each other, among mask layouts, is referred to as a rectangular mask layout.

In FIG. 2, a leftmost pattern may correspond to a target pattern TP or a rectangular mask layout MLrec. The target pattern TP may be, for example, an After Develop Inspection (ADI) target pattern. The rectangular mask layout MLrec may be a mask layout composed of straight lines corresponding to the target pattern TP.

Next, the edge of the rectangular mask layout is dissected into segments (S120). In a second pattern from the left in FIG. 2, a straight line between two adjacent points on the rectangular mask layout MLrec may correspond to a segment. In general, a segment is also referred to as a fragment, and may refer to a straight line corresponding to the edge of a layout or data about the straight line. The edge of the layout may be dissected into multiple segments according to a predetermined dissection rule. The segment length or the dissection rule may be set by a user who performs the OPC method.

For reference, the OPC method refers to a method of correcting the layout of a pattern to prevent an optical proximity effect (OPE) from occurring due to an influence between neighboring patterns during an exposure process as the pattern becomes minute. This OPC method is roughly classified into two types, one of which is a rule-based OPC method, and the other is a simulation-based or model-based OPC method. The OPC method according to some embodiments may be, for example, a model-based OPC method. The model-based OPC method may be advantageous in terms of time and costs because the model-based OPC method uses only measurement results of representative patterns without a need to measure all of a large number of test patterns.

Thereafter, a first shape variable point SVP1 is generated in the rectangular mask layout MLrec (S130). The first shape variable point SVP1 may include a dissection point that is a segment dissection location, a vertex point that is a vertex of the rectangular mask layout MLrec, and additional points on a segment between adjacent vertices. In a second pattern from the left of FIG. 2, the first shape variable point SVP1 includes only a dissection point, which is a segment dissection location, and a vertex point, which is a vertex of the rectangular mask layout MLrec. The first shape variable point SVP1 will be described in more detail with reference to FIGS. 3A and 3B.

Subsequently, a rounded target pattern RTP corresponding to the target pattern is generated (S140). As shown in the second pattern from the left of FIG. 2, the rounded target pattern RTP may have a circular shape inscribed in the sides of the rectangular mask layout MLrec. In correspondence with the shape of the rectangular mask layout MLrec, the rounded target pattern RTP may have a shape in contact with each of the sides according to a predetermined rule and rounded at a vertex portion. For example, when the rectangular mask layout MLrec is a square, the rounded target pattern RTP may have a circular shape as shown in the second pattern from the left in FIG. 2. When the rectangular mask layout MLrec is a rectangle extending in one direction, the rounded target pattern RTP may have an ellipse shape as shown in FIG. 4D.

The temporal order of operation S130 of generating the first shape variable point SVP1 and operation S140 of generating the rounded target pattern RTP may vary. For example, operation S140 of generating the rounded target pattern RTP may be performed first, and operation S130 of generating the first shape variable point SVP1 may be performed. Operation S130 of generating the first shape variable point SVP1 and operation S140 of generating the rounded target pattern RTP may be performed in parallel, according to some embodiments.

Thereafter, the first shape variable point SVP1 is shifted on the rounded target pattern RTP to generate a second shape variable point SVP2 (S150). The second shape variable point SVP2 may be formed by shifting the first shape variable point SVP1 in a normal direction with respect to the rounded target pattern RTP. Generation of the second shape variable point SVP2 will be described in more detail with reference to FIG. 4E.

Figure 4A:
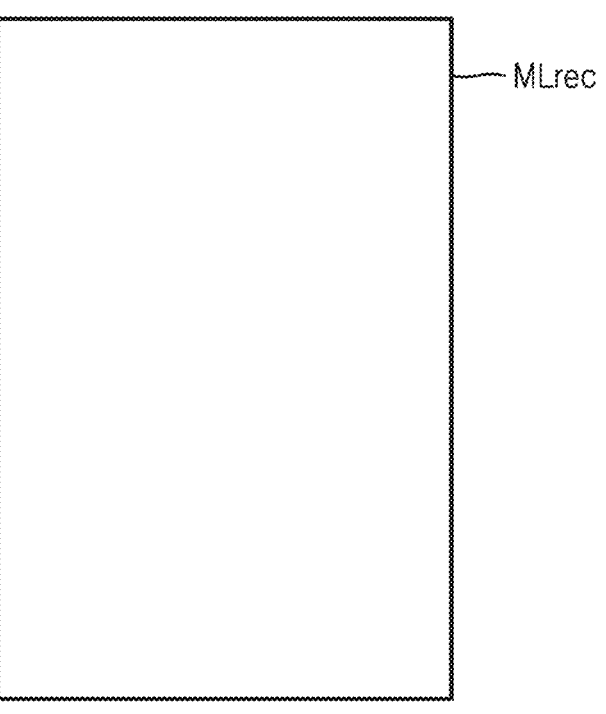
FIGS. 4A through 4H are conceptual diagrams for explaining operations of the OPC method of FIG. 1.
Figure 4B:
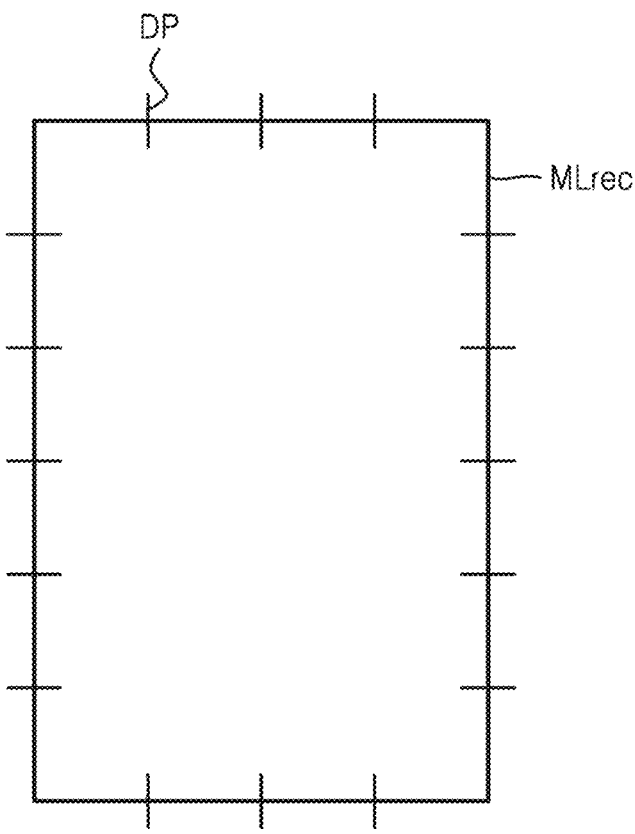
Figure 4C:
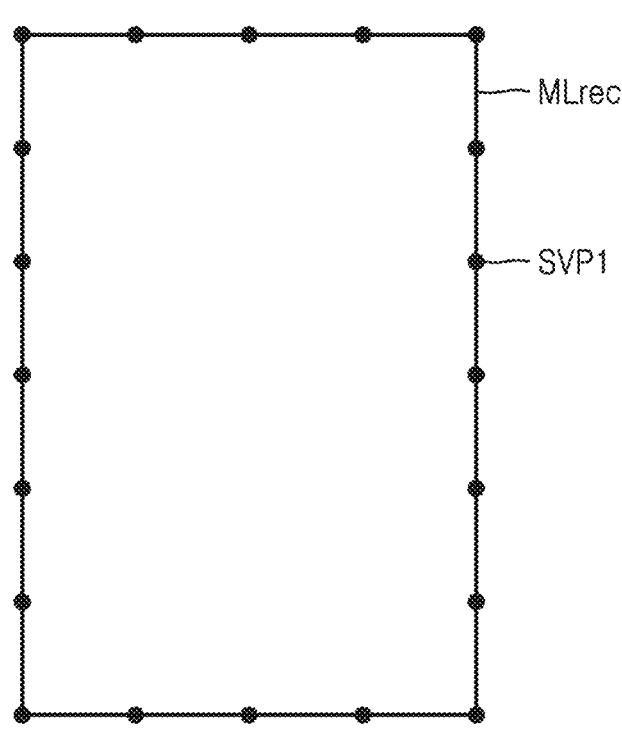
Figure 4D:
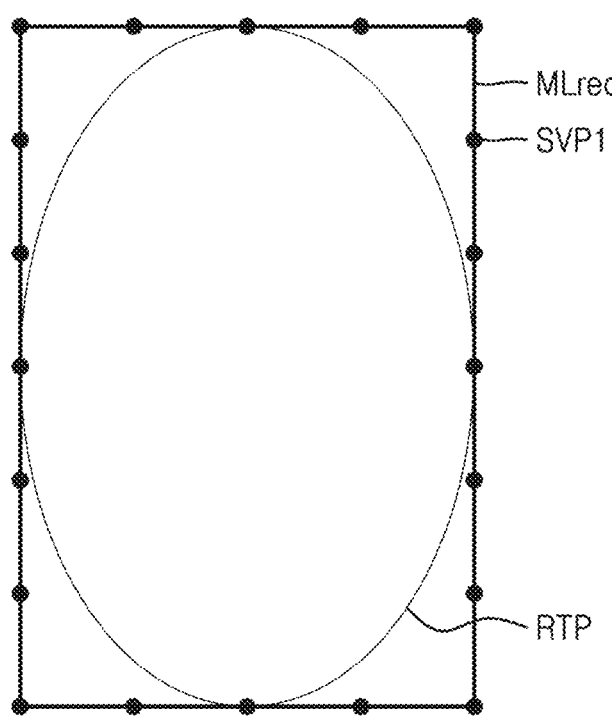
Figure 4E:
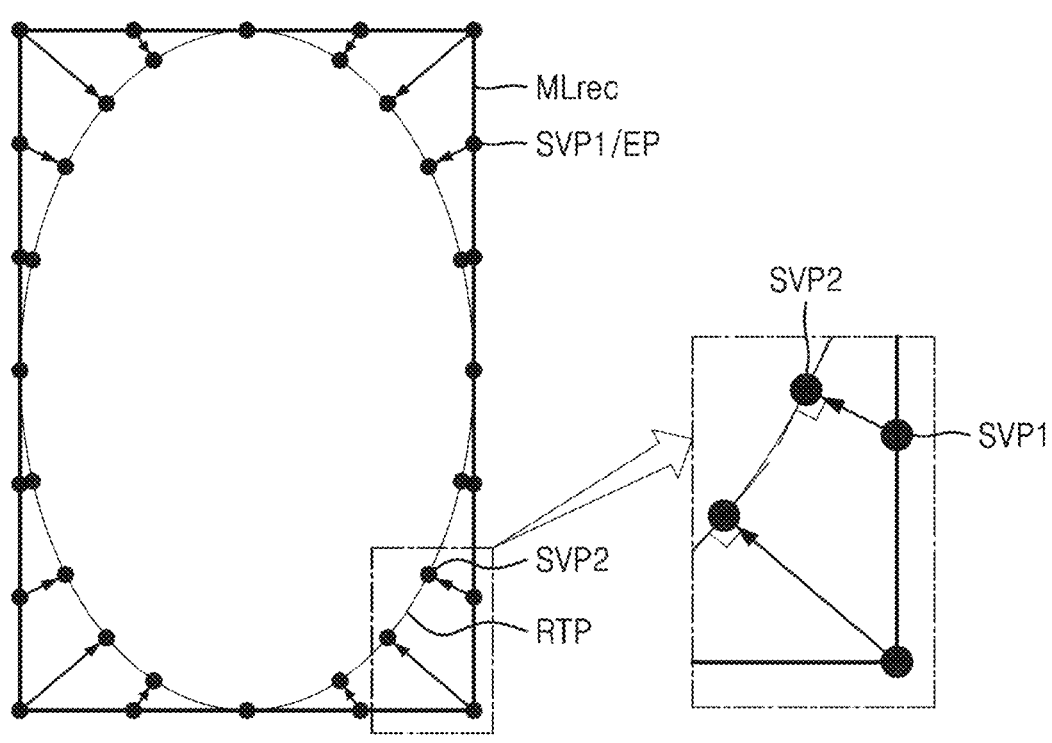
Figure 4F:
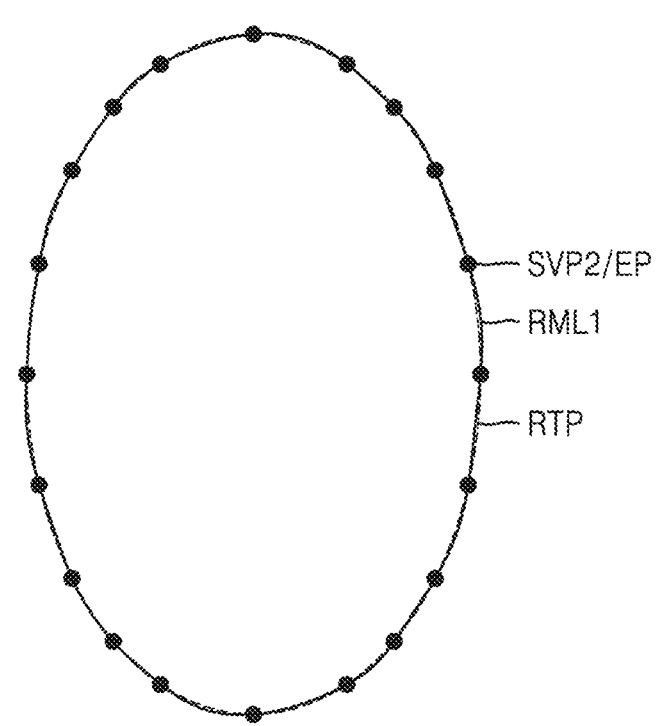

In an operation of generating the second shape variable point SVP2, an evaluation point of FIGS. 4E and 4F may be set. The evaluation point EP refers to a position at which an edge placement error (EPE) is calculated later. In the OPC method according to some embodiments, an initial second shape variable point SVP2 may be set as the evaluation point EP. The second shape variable point SVP2 may continuously change, but the evaluation point EP may be fixed. In other words, the evaluation point EP may be continuously kept on the rounded target pattern RTP.

Subsequently, based on the second shape variable point SVP2, the rectangular mask layout is converted into a curvilinear mask layout RML1 (S160). In a rightmost pattern of FIG. 2, a small inner circle may correspond to an initial first curvilinear mask layout RML1. An external large, closed curve may correspond to a new curvilinear mask layout RML2 created based on a shifted second shape variable point SVP2'.

The curvilinear mask layouts RML1 and RML2 may be generated with a predetermined rule based on the second shape variable points SVP2 and SVP2'. In the OPC method according to some embodiments, the curvilinear mask layouts RML1 and RML2 may be generated in a form in which lines do not cross each other while passing through all of the second shape variable points SVP2 and SVP2' without generating additional points. For example, in the OPC method according to some embodiments, the curvilinear mask layouts RML1 and RML2 may be generated using a Catmull-Rom spline curve method. A method of generating the curvilinear mask layouts RML1 and RML2 by using the Catmull-Rom spline curve method will be described in detail with reference to FIGS. 5A through 5D.

For reference, the shape of the initial curvilinear mask layout RML1 may be almost the same as or very minutely different from that of the rounded target pattern RTP. For example, there may be a slight difference between the shapes of the initial curvilinear mask layout RML1 and the rounded target pattern RTP according to a rule for generating the curvilinear mask layout RML1 based on the second shape variable point SVP2. However, in most cases, the shape of the initial curvilinear mask layout RML1 may be almost identical to the rounded target pattern RTP. Accordingly, the initial curvilinear mask layout RML1 of the rightmost pattern in FIG. 2 may have a circular shape that is substantially the identical to the rounded target pattern RTP shown at a second order from the right in FIG. 2.

Thereafter, a contour of the rounded target pattern RTP is extracted through simulation by inputting data for the curvilinear mask layout RML1 to an OPC model (S170). The data for the curvilinear mask layout RML1 may include data on the edges of the curvilinear mask layout RML1.

The OPC model is a simulation model for extracting the contour of a target pattern, and various basic data may be input as input data to the OPC model. The basic data may include mask data, e.g., data about the edges of the curvilinear mask layout RML1. The basic data may include information data such as a thickness, a refractive index, and a dielectric constant of a photo resist (PR), and may include data of a source map for the shape of an illumination system. Of course, the basic data is not limited to the above example data. The mask data included in the basic data may include not only data of the edges of the curvilinear mask layout RML1, but also various pieces of information about, for example, the shapes or positions of the target pattern and the rounded target pattern.

The contour of the rounded target pattern is a result obtained through a simulation using an OPC model, and may correspond to the shape of the rounded target pattern formed on a wafer in an exposure process using a mask. Therefore, maximally similarizing the contour to the shape of the rounded target pattern may correspond to the purpose of the OPC method of some embodiments.

In FIG. 2, a process of extracting the contour of the rounded target pattern and a process of calculating or determining the EPE are omitted and not shown. Extraction of the contour of the rounded target pattern will be described in more detail with reference to FIG. 4G.

After the contour of the rounded target pattern is extracted, the EPE is calculated at the evaluation point EP (S180). The EPE may refer to a difference between the contour extracted through the simulation using the OPC model and the edge of the rounded target pattern RTP.

The EPE may be calculated using Equation 1 below.

$$EPE = \text{rounded target pattern} - \text{contour} \qquad \text{Equation 1}$$

In brief, the EPE may refer to a difference between the edge of the rounded target pattern and the contour. When the EPE is large, the difference between the contour and the rounded target pattern is large, which may mean that a curvilinear mask layout input to the OPC is not suitable for forming the rounded target pattern. Accordingly, in order to implement a curvilinear mask layout suitable for forming a rounded target pattern, a process of lowering the EPE to a value less than or equal to a set reference value by changing the curvilinear mask layout may be needed. The EPE is calculated for each evaluation point EP, and may be obtained by subtracting a corresponding contour portion from the edge of the rounded target pattern for each evaluation point EP. The EPE calculation is described in more detail with reference to FIG. 4G.

After the EPE calculation, it is determined whether to re-perform operation S170 of extracting the contour of the rounded target pattern (S190). For example, it may be determined whether to further perform operation S170 of extracting the contour of the rounded target pattern, according to whether the calculated EPE exceeds the set reference value. In detail, when the calculated EPE exceeds the set reference value, it is determined that operation S170 of extracting the contour of the rounded target pattern is to be re-performed, and when the calculated EPE is less than or equal to the set reference value, operation S170 of extracting the contour of the rounded target pattern is not re-performed.

According to some embodiments, a determination as to whether to re-perform operation S170 of extracting the contour of the rounded target pattern may be made by comparing the number of simulations or operations using the OPC model with a reference number. In detail, when the number of simulations using the OPC model is less than the reference number, it may be determined that operation S170 of extracting the contour of the rounded target pattern is to be re-performed, and, when the number of simulations using the OPC model is equal to the reference number, it may be determined that operation S170 of extracting the contour of the rounded target pattern is no longer performed. The reference number may be set based on, for example, an average number of times the EPE generally reaches a reference value through the simulation using the OPC model, or a maximum number of times the EPE generally reaches a reference value through the simulation using the OPC model. In addition, the number of simulations performed using the OPC model may be substantially the same as the number of times operation S170 of extracting the contour of the rounded target pattern is performed.

When it is determined that operation S170 of extracting the contour of the rounded target pattern is to be re-performed (Yes), a displacement of the second shape variable point SVP2 is calculated (S192). The displacement of the second shape variable point SVP2 may be obtained for each second shape variable point SVP2 such that the average value of the EPE calculated at the evaluation point EP is minimized or reduced. As one method of obtaining the displacement of the second shape variable point SVP2, there is a method using a feedback factor (FB). For example, the displacement of the second shape variable point SVP2 may be calculated as EPE*FB. The FB may typically be greater than −1 and less than 0. However, the figure of the FB is not limited thereto. Here, (−) and (+) may mean shift directions. As a result, the displacement refers to a distance by which the position of a current second shape variable point SVP2 is shifted toward the rounded target pattern, and may be less than the absolute value of the EPE.

When the displacement of the second shape variable point SVP2 is calculated, the second shape variable point SVP2 is shifted by the displacement (S194). As can be seen from the rightmost pattern of FIG. 2, the second shape variable point SVP2 on the curvilinear mask layout RML1 in a small circular shape may be shifted to the outside to create a new second shape variable point SVP2'.

Subsequently, the OPC method proceeds to operation S160 of generating a curvilinear mask layout. In operation S160 of generating a curvilinear mask layout, a new curvilinear mask layout RML2 is create based on the new second shape variable point SVP2'. Consequently, the shift of the second shape variable point SVP2 to the new second shape variable point SVP2' may correspond to a shift of the edge of the curvilinear mask layout RML1, and may also correspond to a shape change to the new curvilinear mask layout RML2.

Thereafter, operation S170 of extracting the contour, operation S180 of calculating or determining the EPE, and operation S190 of determining whether to re-perform operation S170 of extracting the contour are performed. As described above, these operations may be repeated until the EPE is less than or equal to the set reference value or the number of simulations or number of operations using the OPC model is equal to the set reference number. In operation S170 of extracting the contour, data for the new curvilinear mask layout RML2 may be input as mask data to the OPC model.

When it is determined that operation S170 of extracting the contour is not re-performed (No), the curvilinear mask layout RML2 is determined as a final mask layout (S191). The final mask layout may be referred to as an optical proximity corrected (OPCed) layout, because the final mask layout is a layout on which OPC has been performed. The curvilinear mask layout RML2 may have a curve shape configured to minimize or reduce the EPE, by repeating operations starting at operation S160 of generating the curvilinear mask layout to operation S194 of shifting the second shape variable point (SVP2) by the displacement several times.

In general, in a simulation using an OPC model for the first time, an EPE obtained via contour extraction of a rounded target pattern and subsequent EPE calculation may greatly deviate from a reference value. Therefore, it generally may be determined that operation S170 of extracting the contour is not performed any more, after performing the simulation using the OPC model several to dozens of times. As a result, the final mask layout may be obtained through a process of shifting the second shape variable point SVP2 and generating the curvilinear mask layout RML2 a plurality of number of times.

In the OPC method according to some embodiments, a rectangular mask layout for a target pattern is created, the edges of the rectangular mask layout is dissected into segments, a first shape variable point is created, and a second shape variable point is created by shifting the first shape variable point on a rounded target pattern. Thereafter, a curvilinear mask layout is created based on the second shape variable point, the contour is extracted through simulation using the OPC model, the EPE is calculated, and the simulation using the OPC model is repeated according to a predetermined criterion, thereby realizing a mask layout with minimal EPEs. Therefore, a mask may be created using the mask layout described herein to reduce edge errors by directly controlling movement of points and performing correction by movement of the points.

The OPC method according to some embodiments makes it possible to manufacture an excellent mask capable of optimally forming a target pattern on a wafer by generating a mask layout capable of extracting a contour proximate to a rounded target pattern through the above-described process.

In particular, the OPC method according to some embodiments is a point-based OPC method, and may greatly improve the degree of freedom of a mask layout, compared to an existing segment-based OPC method. In other words, after the edge of the mask layout may be dissected into segments, a dissection point and a vertex point, which are used previously only for defining the geometry, may be simultaneously created as a shape variable point and an evaluation point without using the segments, the shape variable point may be shifted in a normal direction of the rounded target pattern, and a curvilinear mask layout may be created based on the shape variable point. As described above, in the OPC method according to some embodiments, the shape variable point is used instead of the segments, thereby creating a more free curvilinear mask layout. In addition, in the OPC method according to some embodiments, because the shape variable point may be controlled in the normal direction for various angles of the target pattern, free-angle OPC may be implemented.

For reference, in the existing segment-based OPC method, because control is performed based on segments created after dissection, only angle directions at 45° intervals, such as 0°, 45°, and 90°, may be supported, and a segment length for smooth shape generation is also restricted. In addition, because a maximum distance and the like are already determined for each type of segment when the segments are generated, a complex aggressive shape may not be created. As an OPC technology that improves a process window margin, an inverse lithography technology (ILT) tool that maximizes the degree of freedom of an OPC shape is being introduced. However, the ILT tool has problems with an excessive increase in runtime due to backward calculation and a pixel-based mask parameterization method (e.g., a patch boundary handling problem and a mask shape consistency problem), a curvilinear mask manufacturing problem, and the like, and thus is only evaluated in respect of a resolution enhancement technology (RTE) and is not adopted as a product application technology.

In contrast, the OPC method according to some embodiments described herein is based on points, and thus any angle correction, which was impossible in the existing segment-based OPC method, is possible, and a mask layout in a complex shape may be created, so that the OPC method according to some embodiments is excellent in terms of target convergence. In addition, while maintaining advantages such as mask shape consistency, the OPC method according to some embodiments may be widely used by being connected to both general OPC and ILT technologies.

Figure 3A:
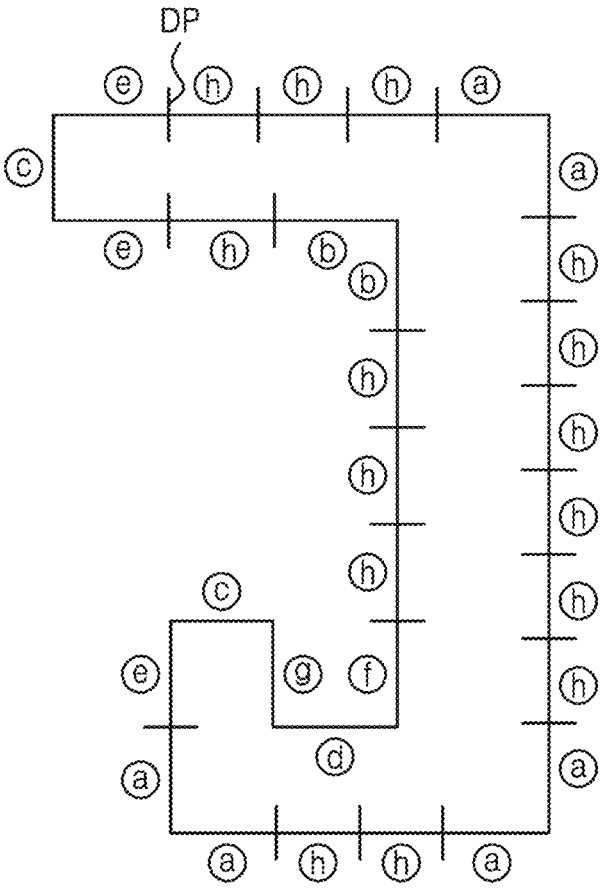
FIGS. 3A and 3B are conceptual diagrams illustrating a principle of generating segments used in an OPC method according to a comparative example and a first shape variable point used in the OPC method according to some embodiments.
Figure 3B:
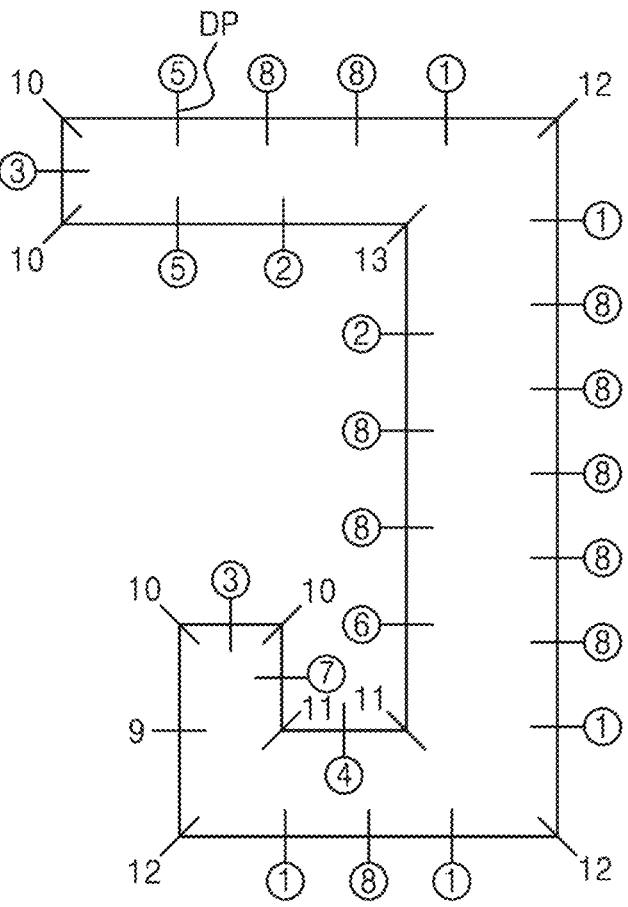

FIGS. 3A and 3B are conceptual diagrams illustrating a principle of generating segments used in an OPC method according to a comparative example and a first shape variable point used in the OPC method according to some embodiments. Descriptions of FIGS. 3A and 3B which are the same as those of FIGS. 1 and 2 are given briefly or omitted herein.

Referring to FIG. 3A, in the case of the OPC method according to a comparative example, the edges of a mask layout are dissected at a dissection point DP, and segments ⓐ through ⓗ generated after the dissection are used in a subsequent OPC process. As described above, in the case of a segment-based OPC, there may be restrictions on an angle, a distance, etc. in the shift of the segments ⓐ through ⓗ. For reference, the segments ⓐ through ⓗ may be classified into an out-corner segment ⓐ, an in-corner segment ⓑ, a line-end segment ⓒ, a space-end segment ⓓ, a line-end-side segment ⓔ, a space-end-side segment ⓕ, a single segment ⓖ, a run segment ⓗ, and the like.

Referring to FIG. 3B, in the case of the OPC method according to some embodiments, the edges of the mask layout are dissected at the dissection point DP, and the first shape variable point SVP1 is used in an OPC process instead of using the segments generated after the dissection. The first shape variable point SVP1 includes dissection points ①, ②, ⑤ to ⑧, which are dissection locations of segments, vertex points 10 through 13, which are vertices of the mask layout, and additional points ③ and ④ on a segment between adjacent vertices.

Because the dissection points ①, ②, ⑤ to ⑧ correspond to the dissection locations of segments, the dissection points ①, ②, ⑤ to ⑧ may include an out-corner dissection point ①, an in-corner dissection point ②, a line-end-side dissection point ⑤, a space-end-side dissection point ⑥, a single dissection point ⑦, and a run dissection point ⑧, similar to segments according to a comparative example. The vertex points 10 through 13 may include a line-end vertex point 10, a space-end vertex point 11, an out vertex point 12, and an in vertex point 13. The additional points ③ and ④ may also include a line-end additional point ③ and a space-end additional point ④ due to segments at similar locations according to a comparative example. Although not shown in FIG. 3B, a jog vertex point indicating a fine protrusion or a recessed portion existing in the section of the run dissection points ⑧ may be included in the first shape variable point SVP1.

In the OPC method according to some embodiments, the first shape variable point SVP1 may be created on a dissection point, and vertex points having various types may be additionally generated on the vertex. Therefore, in the OPC method according to some embodiments, different point types are created for different first type variable points SVP1, and special care may be achieved through various tagging, thus enabling active control of various situations. In addition, because the first shape variable point SVP1 is created based on the geometry, an OPCed layout capable of maintaining mask shape consistency may be created.

FIGS. 4A through 4H are conceptual diagrams for explaining the operations of the OPC method of FIG. 1. FIGS. 4A through 4H will be described in conjunction with reference to FIG. 1, and the matters already described above with reference to FIGS. 1 through 3B will be briefly described or omitted.

Referring to FIG. 4A, first, a rectangular mask layout MLrec for a target pattern on a wafer is created. As described above, the target pattern and the rectangular mask layout may differ only in size and may have substantially the same shapes. The target pattern may be, for example, an ADI target pattern.

Referring to FIG. 4B, an edge of the rectangular mask layout MLrec is dissected into segments through dissection points DP. A line between adjacent dividing points DP may correspond to a segment. Although not shown in FIG. 4B, the vertices of the rectangular mask layout MLrec may also be included in dissection points, and thus, a line between a vertex and a dissection point DP adjacent to each other may also correspond to a segment.

Referring to FIG. 4C, a first shape variable point SVP1 is generated in the rectangular mask layout MLrec. The first shape variable point SVP1 may include dissection points that are dissection locations for segments, vertex points that are vertices of the rectangular mask layout MLrec, and additional points on segments between adjacent vertices. In FIG. 4C, the first shape variable point SVP1 may include only the dissection points and the vertex points.

Referring to FIG. 4D, a rounded target pattern RTP corresponding to a target pattern is generated. As shown in FIG. 4D, the rounded target pattern RTP may be in contact with each of the sides of the rectangular mask layout MLrec and may have a rounded shape at its vertex portion. The rounded target pattern RTP may be created by applying a predetermined rule to a corresponding target pattern or the rectangular mask layout MLrec. The rounded target pattern RTP may be created in consideration of the entire shape of the target pattern or the entire shape of the rectangular mask layout MLrec without being limited by a specific portion.

Referring to FIG. 4E, thereafter, the first shape variable point SVP1 is shifted on the rounded target pattern RTP to create a second shape variable point SVP2. As shown in a right enlarged view of FIG. 4F, the second shape variable point SVP2 may be created on the rounded target pattern RTP by shifting the first shape variable point SVP1 in a direction normal to the rounded target pattern RTP.

In more detail, when a first shape variable point SVP1 is shifted and at this time the first shape variable point SVP1 becomes too close to its neighboring first shape variable point SVP1 or the two first shape variable points SVP1 are twisted with each other and their locations are switched with each other, an abnormal curvilinear mask layout may be created. Therefore, a shift direction needs to be set so that neighboring first shape variable points SVP1 do not meet each other or do not come close to each other. In the OPC method according to some embodiments, as shown in FIG. 4E, the first shape variable points SVP1 are projected onto the rounded target pattern RTP in the normal direction to create second shape variable points SVP2 to be located on the rounded target pattern RTP. Twisting between the second shape variable points SVP2 may be minimized by setting the shift direction so that the second shape variable points SVP2 may shift only in the normal direction of the rounded target pattern RTP in the future.

After an initial second shape variable point SVP2 is created by shifting the first shape variable point SVP1, the initial second shape variable point SVP2 is set as an evaluation point EP. Therefore, at first, the second shape variable point SVP2 and the evaluation point EP may be substantially the same as each other. However, as will be described later, the second shape variable point SVP2 continuously changes, whereas the evaluation point EP remains at a fixed position and may be used for EPE calculation.

Referring to FIG. 4F, subsequently, the rectangular mask layout MLrec is converted into the curvilinear mask layout RML1, based on the second shape variable point SVP2. The conversion into the curvilinear mask layout RML1 may be performed according to a predetermined rule based on the second shape variable point SVP2. In the OPC method according to some embodiments, the curvilinear mask layout RML1 may be generated in the form in which lines do not cross each other while passing through all of the second shape variable points SVP2 without generating additional points. For example, in the OPC method according to some embodiments, the curvilinear mask layout RML1 may be generated using a Catmull-Rom spline curve method, which is a type of interpolating spline that creates a curve that goes through its control points. The conversion to the curvilinear mask layout RML1 may be referred to as a conversion from the second shape variable point SVP2 instead of the rectangular mask layout MLrec.

In FIG. 4F, the curvilinear mask layout RML1 is indicated by a solid line, and the rounded target pattern RTP is indicated by a dotted line. As can be seen from FIG. 4F, initially, the shapes of the rounded target pattern RTP and the curvilinear mask layout RML1 may be substantially the same as each other or may have only minor differences. However, the inventive concept is not limited thereto. In some cases, the shapes of the curvilinear mask layout RML1 and the rounded target pattern RTP may be slightly different from each other. For example, in some embodiments, a method other than the Catmul-Rom spline curve method is applicable to the creation of the curvilinear mask layout RML1. In this case, the shape of the created curvilinear mask layout RML1 may be somewhat different from that of the rounded target pattern RTP.

Figure 4G:
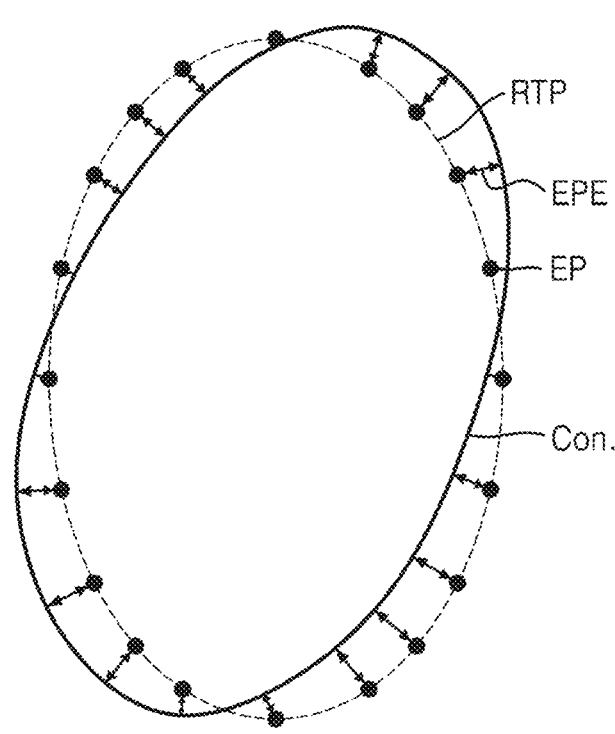

Referring to FIG. 4G, thereafter, a contour Con. of the rounded target pattern RTP is extracted through a simulation by inputting data for the curvilinear mask layout RML1 to an OPC model. In general, a contour Con. of a rounded target pattern initially extracted through a simulation using an OPC model may greatly deviate from the shape of the rounded target pattern (RTP). It can be seen from FIG. 4G that the shape of the rounded target pattern (RTP) indicated by a dotted line and the shape of the contour Con. indicated by a solid line are different from each other.

Subsequently, the EPE is calculated from the evaluation point EP. The EPE may be calculated using Equation 1 above. In other words, the EPE may be calculated by subtracting a corresponding position of the contour Con. from the evaluation point EP of the rounded target pattern TRP. The corresponding position of the contour Con. may be set in a normal direction from the evaluation point EP, or may be set as a shortest distance from the evaluation point EP. Then, the displacement of the second shape variable point SVP2 may be calculated based on the EPE.

Figure 4H:
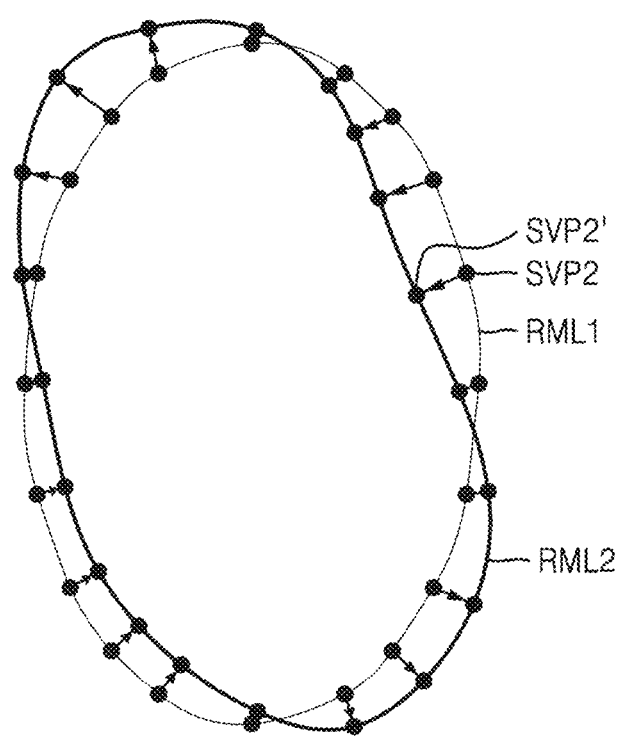

Referring to FIG. 4H, after the displacement of the second shape variable point SVP1 is calculated, the second shape variable point SVP2 is shifted by the displacement to create the new second shape variable point SVP2'. Thereafter, the new curvilinear mask layout RML2 is created based on the new second shape variable point SVP2'. The new curvilinear mask layout RML2 may be created by applying the same method as the method of previously creating the curvilinear mask layout RML1, for example, the Catmull-Rom spline curve method.

Figure 5A:
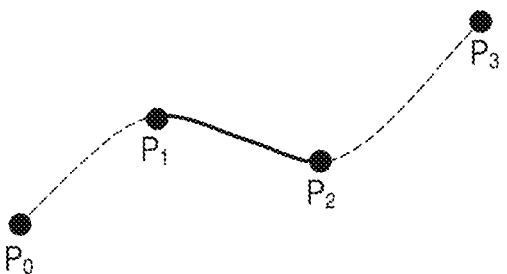
FIGS. 5A through 5D are conceptual diagrams for explaining an operation of performing conversion to a curvilinear mask layout in the OPC method of FIG. 1.
Figure 5B:
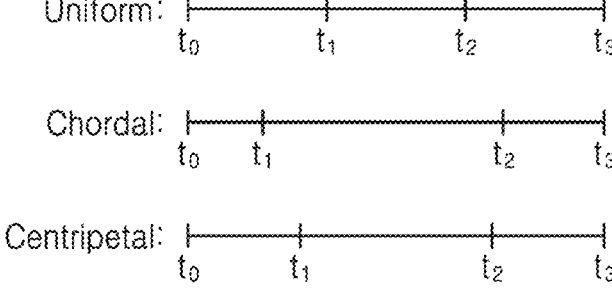
Figure 5C:
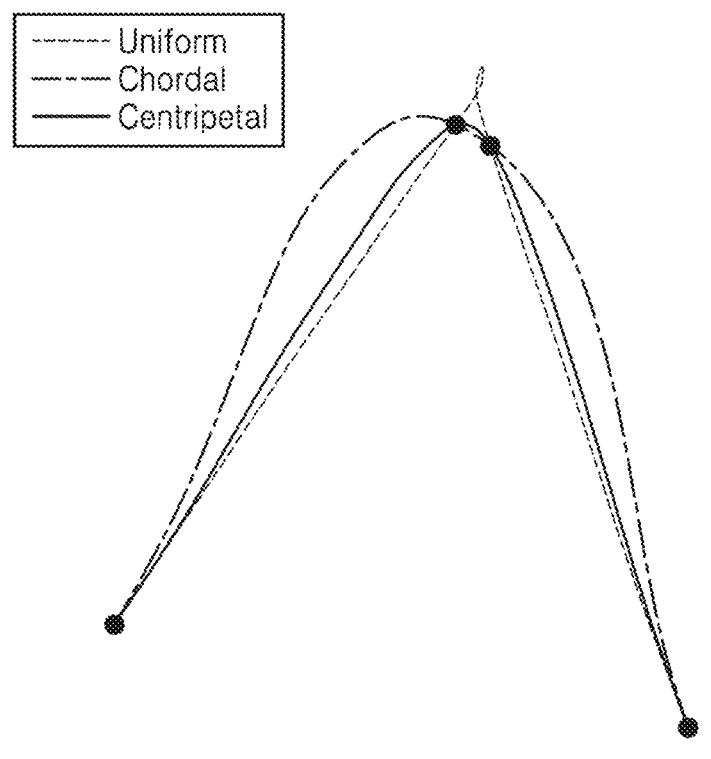
Figure 5D:
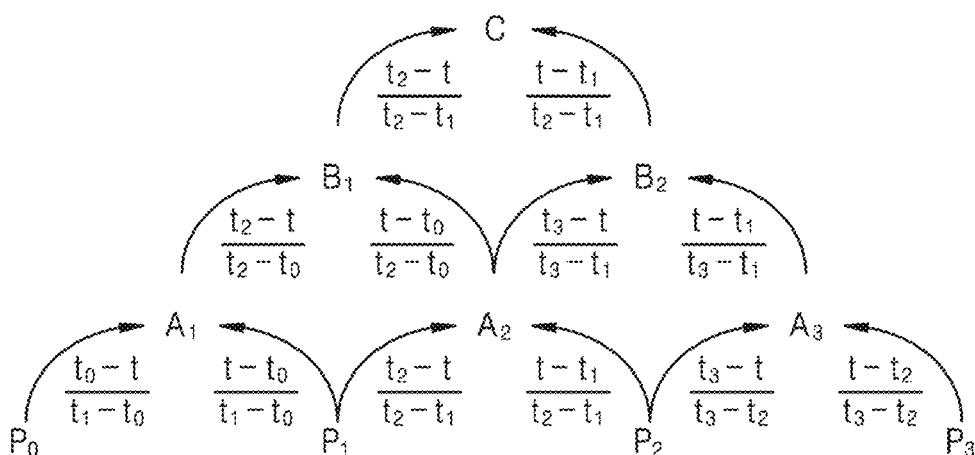

FIGS. 5A and 5D are conceptual diagrams for explaining an operation of performing conversion to a curvilinear mask layout in the OPC method of FIG. 1. Descriptions of FIGS. 5A through 5D which are the same as those of FIGS. 1 through 4H are given briefly or omitted herein.

Referring to FIGS. 5A through 5D, in the OPC method according to some embodiments, the conversions to the curvilinear mask layouts RML1 and RML2 based on the second shape variable points SVP2 and SVP2' may employ a Catmull-Rom spline curve method that performs interpolation in consideration of the positions of four adjacent points.

An advantage of the Catmull-Rom spline curve method is that the curvilinear mask layouts RML1 and RML2 can be created only with the second shape variable points SVP2 and SVP2' without generating additional points for curve conversion. As can be seen from FIG. 5B, parameterization of the knot of the Catmull-Rom spline curve method may be classified into three types. In other words, the parameterization is expressed as Equation 2 below.

$$t_{i+1} = \left[\left\{(x_{i+1}x_i)^2 + (y_{i+1}y_i)^2\right\}^{1/2}\right]^{\alpha} + t_i \qquad \text{Equation (2)}$$

wherein, when $\alpha$ is 0, Equation 2 corresponds to a uniform Catmull-Rom spline curve, when $\alpha$ is 0.5, Equation 2 corresponds to is a centripetal Catmull-Rom spline curve, and when $\alpha$ is 1, Equation 2 corresponds to a chordal Catmull-Rom spline curve. FIG. 5C illustrates a uniform Catmull-Rom spline curve Uniform indicated by a dotted line, a chordal Catmull-Rom spline curve Chordal indicated by a dashed line, and a centripetal Catmull-Rom spline curve Centripetal indicated by a solid line. In the OPC method according to some embodiments, a centripetal Catmull-Rom spline curve method is applicable to create the curvilinear mask layouts RML1 and RML2. When the centripetal Catmull-Rom spline curve method is applied, a shape in which lines intersect with each other is prevented, and thus, when the lines are connected to each other, even a complex polygon may be converted into a curvilinear shape without errors. In the centripetal Catmull-Rom spline curve method, a curve is created in a form passing through all the points used, and thus an approximate value in a curve shape may be intuitively predicted only by the positions of the points.

FIG. 5D illustrates a detailed equation for creating curve segments for four points $P_0$, $P_1$, $P_2$, and $P_3$. Consequently, a curve segment C may be calculated using $(t_2-t)/(t_2-1)*B_1 + (t-t_1)/(t_2-t_1)*B_2$. As can be seen from FIG. 5D, C may be eventually calculated based on $P_0$, $P_1$, $P_2$, and $P_3$.

Use of the Catmull-Rom spline curve method has been described up to now in relation to the creation of the curvilinear mask layouts RML1 and RML2. However, in the OPC method according to some embodiments, a method of creating the curvilinear mask layouts RML1 and RML2 is not limited to the centripetal Catmull-Rom spline curve method. In addition, the method of creating the curvilinear mask layouts RML1 and RML2 is not limited to the Catmull-Rom spline curve method.

FIGS. 6, 7A, 7B, 8A, 8B, 9A, 9B, 10A, and 10B are conceptual diagrams illustrating a comparison between a method of creating a mask layout in the OPC method according to a comparative example and a method of creating a mask layout in the OPC method of some embodiments. FIGS. 7A, 8A, 9A, and 10A are conceptual diagrams of the OPC method according to a comparative example, and FIGS. 7B, 8B, 9B, and 10B are conceptual diagrams of the OPC method according to some embodiments.

Figure 6:
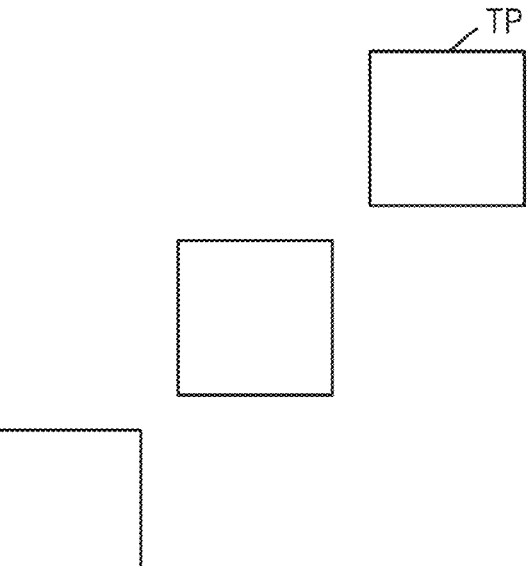
FIGS. 6, 7A, 7B, 8A, 8B, 9A, 9B, 10A, and 10B are conceptual diagrams illustrating a comparison between a method of creating a mask layout in an OPC method according to a comparative example and a method of creating a mask layout in the OPC method of some embodiments.

Referring to FIG. 6, target patterns TP adjacent to each other in a diagonal direction are shown. A rectangular mask layout may be created for each of the target patterns TP. An OPC process will now be described by focusing on the target pattern TP at the center.

Figure 7A:
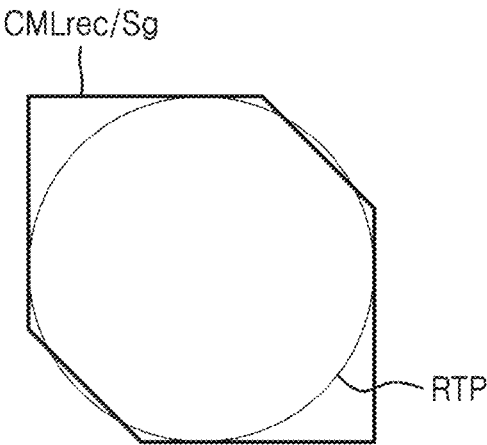
Figure 7B:
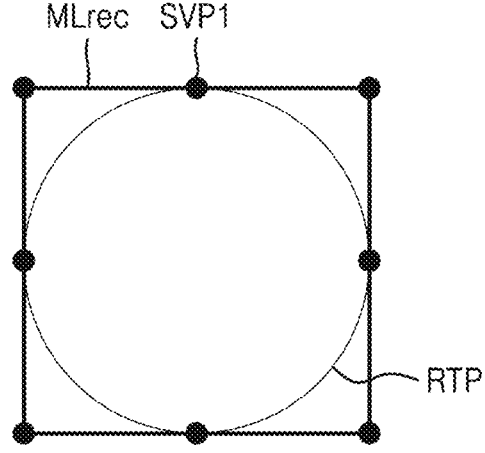

Referring to FIGS. 7A and 7B, in the OPC method according to a comparative example, a rectangular mask layout CMLrec and a rounded target pattern RTP are illustrated. Each side of the rectangular mask layout CMLrec may correspond to a segment Sg. In other words, the rectangular mask layout CMLrec is dissected through vertices, and sides between the vertices may correspond to the segments Sg. For reference, the rectangular mask layout CMLrec of FIG. 7A may be created by a segment-based cut OPC method. In the cut OPC method, in order to overcome mask rule check (MRC) violation between diagonally-adjacent vertex portions, the rectangular mask layout CMLrec may be created in a form in which vertex portions are cut out.

In the OPC method according to some embodiments, the rectangular mask layout MLrec and the rounded target pattern RTP are illustrated. The rectangular mask layout MLrec may have a rectangular shape that is substantially the same as the target pattern TP. First shape variable points SVP1 may be created on the edges of the rectangular mask layout MLrec.

Figure 8A:
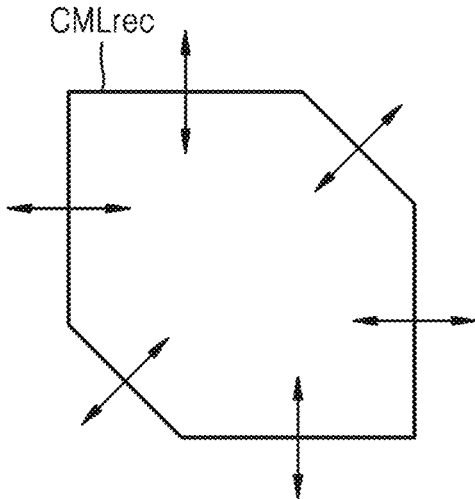
Figure 8B:
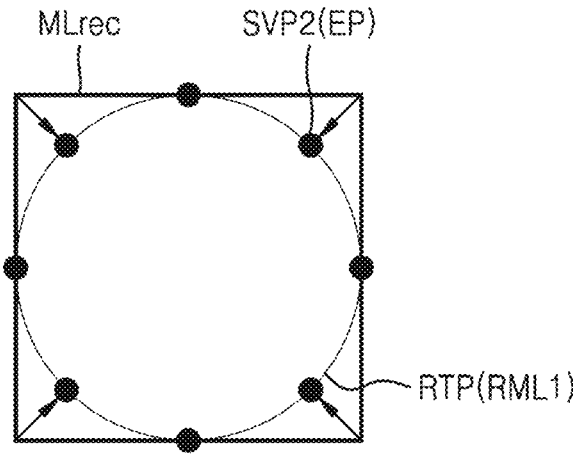

Referring to FIGS. 8A and 8B, in the OPC method according to the comparative example, directions in which the segments Sg on the rectangular mask layout CMLrec are able to shift are indicated by two-way arrows. For example, as can be seen from FIG. 8A, in the OPC method according to the comparative example, the segments Sg may only shift in directions of 0°, 45°, and 90°.

In the OPC method according to some embodiments, the second shape variable point SVP2 is created by shifting the first shape variable point SVP1 on the rectangular mask layout MLrec to the rounded target pattern RTP. As described above, the second shape variable point SVP2 may be created by shifting the first shape variable point SVP1 in the normal direction of the rounded target pattern RTP. The curvilinear mask layout RML1 may be created based on the second shape variable point SVP2. The creation of the curvilinear mask layout RML1 may use, for example, the Catmull-Rom spline curve method. The initial second shape variable point SVP2 may be defined as the evaluation point EP.

Figure 9A:
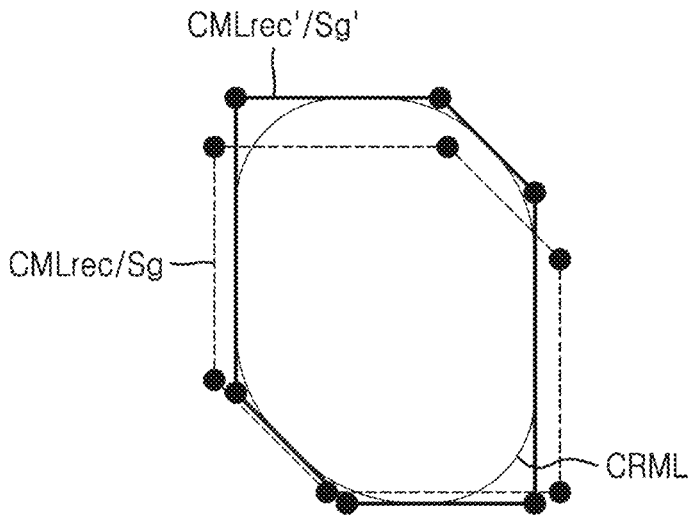
Figure 9B:
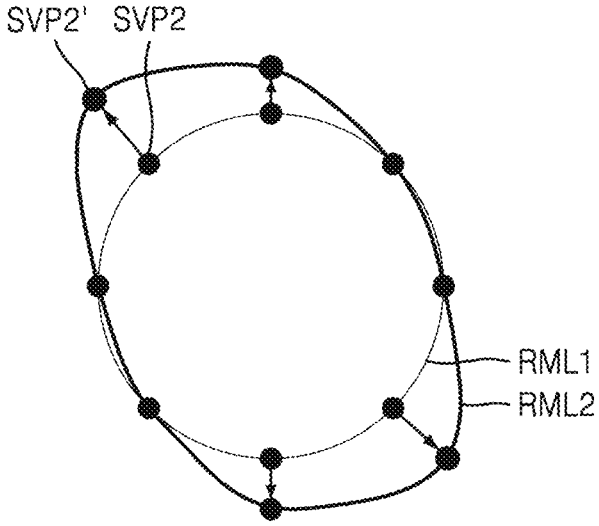

Referring to FIGS. 9A and 9B, in the OPC method according to a comparative example, segments Sg are shifted to create new segments Sg' and a new rectangular mask layout CMLrec' based on the new segments Sg'. In FIG. 9A, a dotted line indicates a previous rectangular mask layout CMLrec and the segments Sg, and a solid line indicates the new rectangular mask layout CMLrec' and the segments Sg'. A curvilinear mask layout CRML may be created through corner rounding inside the new rectangular mask layout CMLrec'. Before the segments Sg are shifted, the contour for the rounded target pattern RTP and the displacement of the segments Sg may be calculated, and the segments Sg may shift according to the displacement.

In the OPC method according to some embodiments, a new second shape variable point SVP2' is created by shifting the second shape variable point SVP2. Before the second shape variable point SVP2 is shifted, the contour for the rounded target pattern RTP and the displacement of the second shape variable point SVP2 may be calculated, and the second shape variable point SVP2 may shift according to the displacement. The second shape variable point SVP2 may shift in the normal direction of the rounded target pattern RTP. In the case of the shift of the second shape variable point SVP2, there may be no restrictions on an angular direction and a distance.

After the new second shape variable point SVP2' is created, a new curvilinear mask layout RML2 is created based on the new second shape variable point SVP2'. The creation of the new curvilinear mask layout RML2 may also use, for example, the Catmull-Rom spline curve method.

Figure 10A:
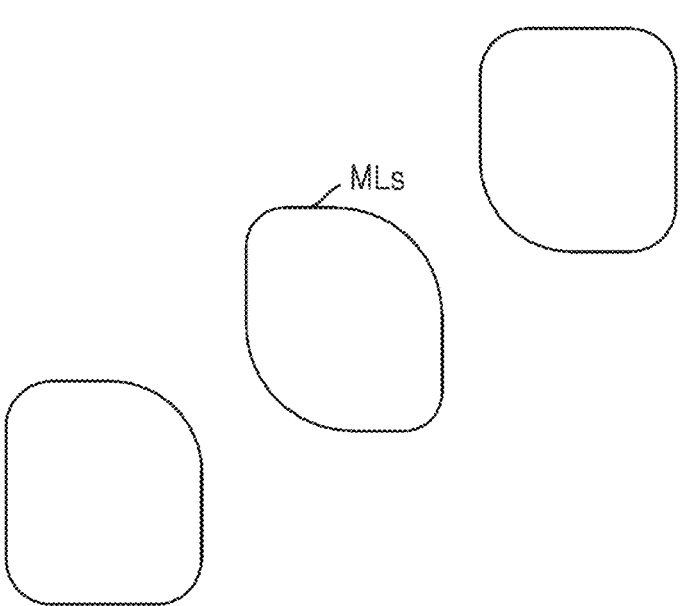
Figure 10B:
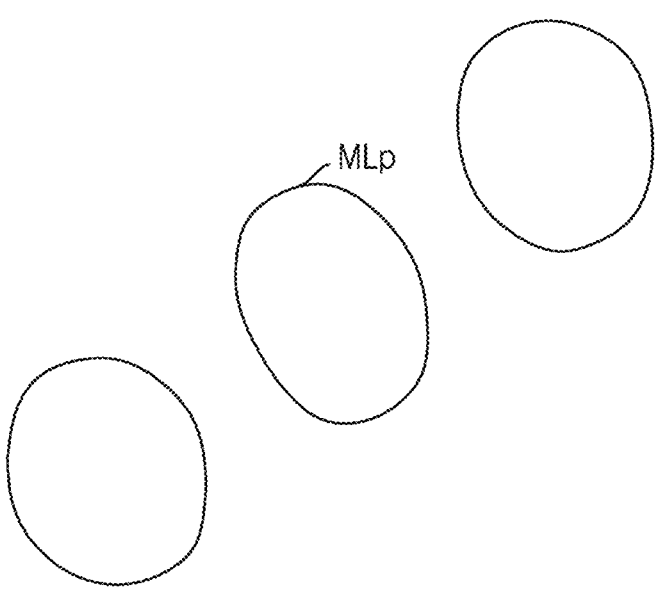

FIG. 10A shows a final mask layout MLs created by the OPC method according to a comparative example, and FIG.

10B shows a final mask layout MLp created by the OPC method according to some embodiments. As a result, it can be confirmed that the final mask layout MLp obtained through the point-based OPC method according to some embodiments is close to a target pattern and corresponds to an ideal shape capable of effectively overcoming MRC violation.

Figure 11A:
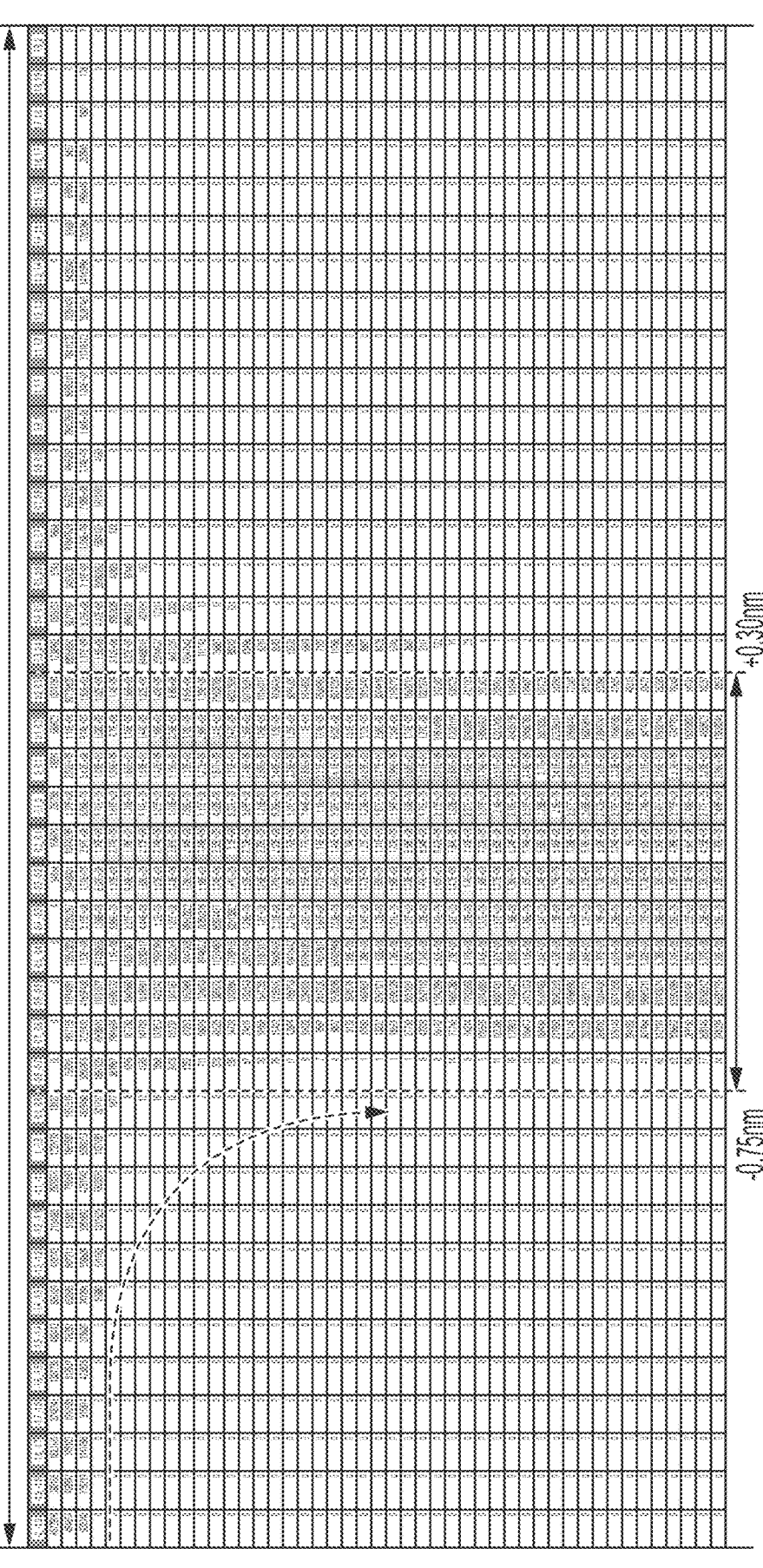
FIGS. 11A and 11B are images of edge placement error (EPE) values according to repeated simulations using an OPC model in an OPC method according to a comparative example and the OPC method according to some embodiments.
Figure 11B:
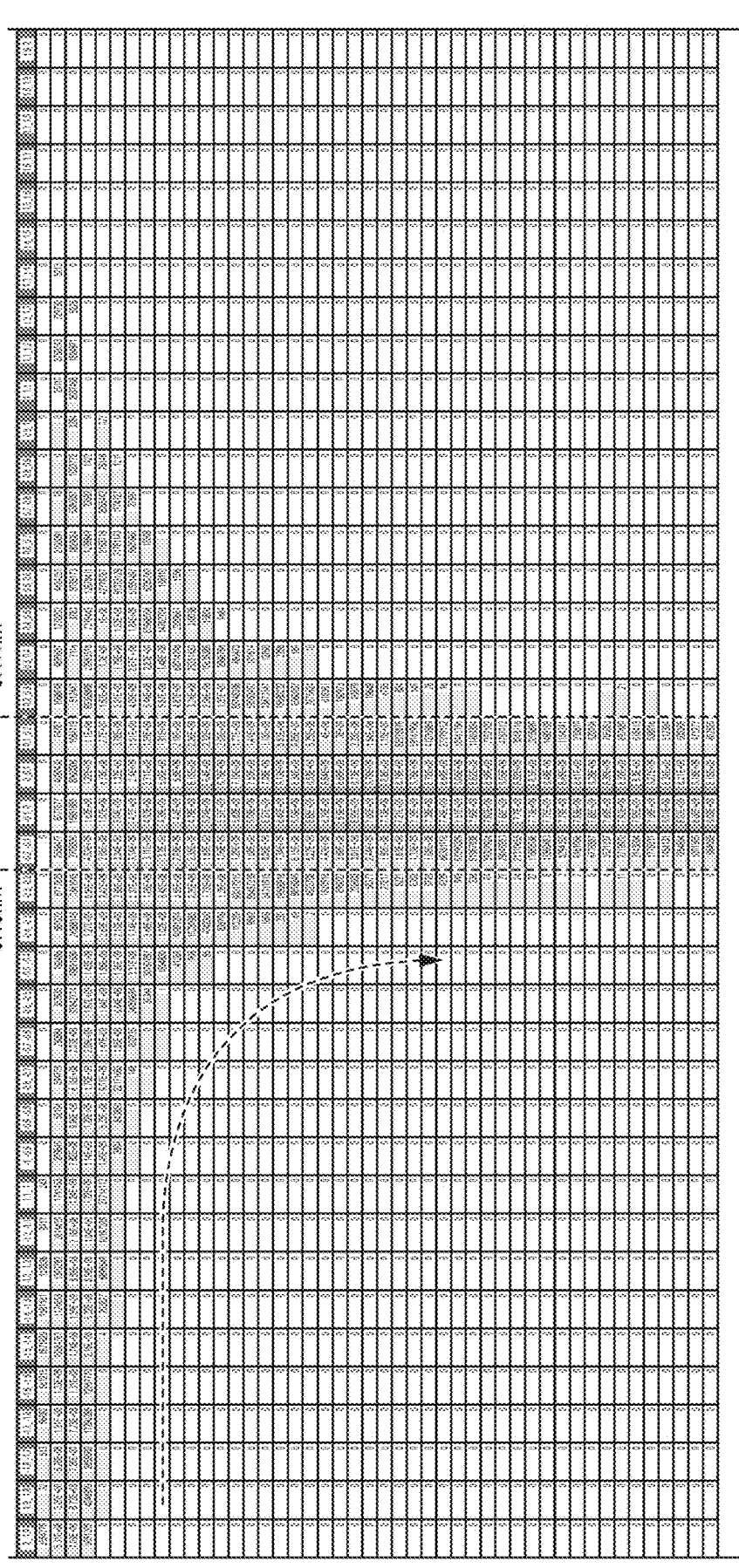

FIGS. 11A and 11B are images of EPE values according to repeated simulations using the OPC model in the OPC method according to a comparative example and the OPC method according to some embodiments. In FIGS. 11A and 11B, the x-axis represents the EPE values, and the y-axis represents the number of iterations.

Referring to FIG. 11A, in the case of the OPC method according to a comparative example, an out-corner EPE has a worst value of about −0.747 nm. The out-corner EPE may correspond to a calculated EPE value in a diagonal direction. For reference, a center EPE is about ±0.2 nm in the OPC method according to a comparative example. The center EPE may refer to a horizontal or vertical EPE.

Referring to FIG. 11B, in the case of the OPC method according to some embodiments, an out-corner EPE has a worst value of about −0.197 nm. Therefore, about 74% is improved compared to the OPC method according to a comparative example. Also in the OPC method according to some embodiments, the center EPE is about ±0.2 nm, which is a level similar to that of the OPC method according to a comparative example. In addition, as can be seen from curved arrows in FIG. 11A and FIG. 11B, in the case of simulation iterations of the OPC method according to some embodiments, the EPE decreases very rapidly. For example, compared with the OPC method according to a comparative example, the OPC method according to some embodiments described herein may improve the number of simulation iterations by 50% or more, and thus, may improve the runtime of OPC by 2 times or more. In other words, the techniques described herein, as applied to the practical application of mask creation for semiconductor processes, significantly reduce the time and computational power to produce an accurate mask layout for mask manufacturing, while improving the error correction by moving points during layout creation.

Figure 12:
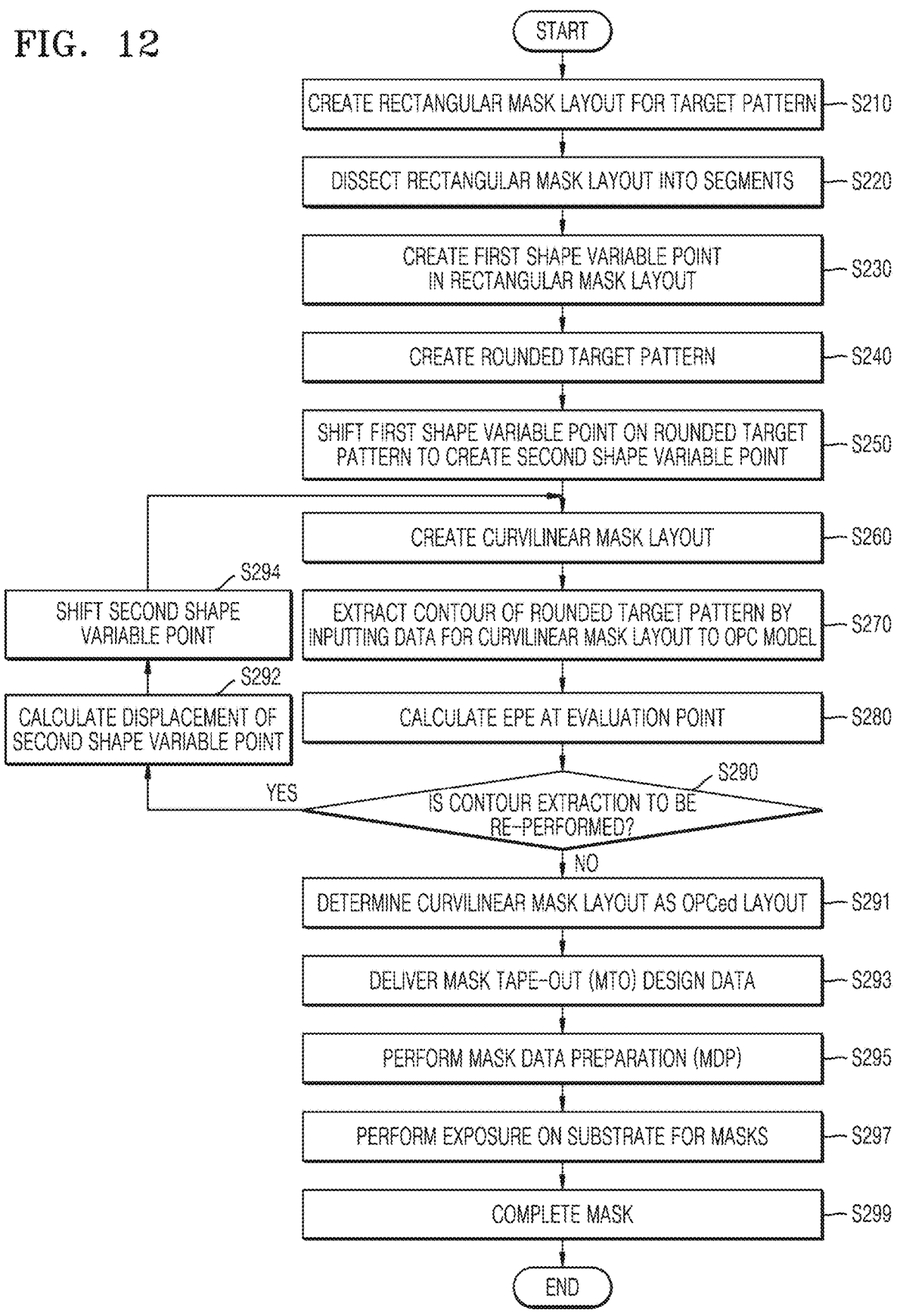
FIG. 12 is a flowchart of a mask manufacturing method using an OPC method, according to some embodiments.

FIG. 12 is a flowchart of a mask manufacturing method using an OPC method, according to some embodiments. FIG. 12 will be described in conjunction with reference to FIG. 1, and the matters already described above with reference to FIGS. 1 through 11B will be briefly described or omitted.

Referring to FIG. 12, in the mask manufacturing method using the OPC method according to some embodiments (hereinafter, simply referred to as a 'mask manufacturing method'), the OPC method is first performed. The OPC method may include operation S210 of generating a rectangular mask layout for a target pattern through to operation S291 of determining a curvilinear mask layout as an OPCed layout. In the mask manufacturing method according to some embodiments, the OPC method may be, for example, a point-based method. Accordingly, the OPC method may be the OPC method of FIG. 1. In detail, operation S210 of generating a rectangular mask layout for a target pattern through to operation S291 of determining a curvilinear mask layout as an OPCed layout may correspond to operation S110 of creating the rectangular mask layout for the target pattern through to operation S191 of determining the curvilinear mask layout as the final mask layout of the OPC method of FIG. 1. For reference, the final mask layout and the OPCed layout may have substantially the same meaning. Therefore, in the mask manufacturing method according to some embodiments, a description of each of operations S210 through S291 of the OPC method is omitted.

After the OPC method is performed, mask tape-out (MTO) design data is delivered to a mask manufacturing team (S293). In general, MTO may refer to requesting mask manufacture by handing over data for a final mask layout obtained through the OPC method to a mask manufacturing team. Therefore, in the mask manufacturing method according to some embodiments, the MTO design data may be substantially the same as data for an OPCed layout obtained through the OPC method. Such MTO design data may have a graphic data format used in electronic design automation (EDA) software or the like. For example, the MTO design data may have a data format such as a Graphic Data System II (GDS2) or an Open Artwork System Interchange Standard (OASIS).

Thereafter, a mask data preparation (MDP) is performed (S295). The MDP may include, for example, i) format transformation called fracturing, ii) augmentation of a bar-code for mechanical reading, a standard mask pattern for inspection, job deck, etc., and iii) automatic and manual verification. The job deck may refer to making a text file related to a series of instructions, such as layout information of multiple mask files, a reference dose, and an exposure speed or method.

The format transformation, namely, fracturing, may refer to a process of fracturing the MTO design data for each area and changing a format of the fractured MTO design data to a format for electronic beam exposure devices. The fracturing may include, for example, data manipulation such as scaling, sizing of data, rotation of the data, pattern reflection, or color inversion. During transformation through fracturing, data about many systematic errors that may be generated anywhere during delivery from design data to an image on a wafer may be corrected.

The process of correcting the data about the systematic errors is called mask process correction (MPC), and may include, for example, linewidth control called CD control and an operation of increasing pattern layout precision. Accordingly, the fracturing may contribute to improvement in the quality of a final mask, and may be a process performed in advance to achieve MPC. The systematic errors may be caused due to distortion that occurs in an exposure process, a mask development and etching process, and a wafer imaging process.

The MDP may include MPC. The MPC refers to a process of correcting an error that is generated during an exposure process as described above, namely, a systematic error. The exposure process may be a concept including all of electronic beam writing, development, etching, and baking. Data processing may be further performed before the exposure process. The data processing is a process of pre-processing mask data, and thus may include grammar check of mask data, exposure time prediction, and the like.

After the MDP, exposure is performed on a substrate for masks, based on the mask data (S297). The exposure may refer to, for example, electronic beam writing. The electronic beam writing may be performed according to, for example, a gray writing method using a multi-beam mask writer (MBMW). The electronic beam writing may be performed using a variable shape beam (VSB) exposure device.

After the MDP, a process of transforming the mask data into pixel data may be performed before an exposure process. The pixel data is directly used in actual exposure, and may include data about a shape that is to be exposed, and data about a dose allocated to the shape. The data about a shape may be bitmap data into which shape data that is vector data is transformed through rasterization or the like.

After the exposure process, a series of processes may be conducted to thereby complete a mask (S299). The series of processes may include, for example, development, etching, and cleaning. The series of processes for mask manufacture may include a measurement process, a defect inspection, repairing process, or the like. The series of processes for mask manufacture may also include a pellicle coating process. The pellicle coating process refers to a process of attaching a pellicle to protect a mask surface from subsequent contamination during the delivery of a mask and the useful lifespan of the mask, when it is confirmed through final cleaning and inspection that there are no contaminants or chemical stains.

While the inventive concept has been particularly shown and described with reference to embodiments thereof, it will be understood that various changes in form and details may be made therein without departing from the spirit and scope of the following claims.

What is claimed is:

1. An optical proximity correction (OPC) method comprising:
creating a rectangular mask layout for a target pattern on a wafer;
creating a first shape variable point on an edge of the rectangular mask layout;
creating a rounded target pattern corresponding to the target pattern;
creating a second shape variable point by shifting the first shape variable point on the rounded target pattern;
converting the rectangular mask layout into a curvilinear mask layout, based on the second shape variable point;
extracting a contour of the rounded target pattern based on the curvilinear mask layout;
determining an edge placement error (EPE) comprising a difference between the contour and an edge of the rounded target pattern, at a set evaluation point;
determining whether the extracting of the contour is to be re-performed;
determining a displacement for the second shape variable point when it is determined that the extracting of the contour is to be re-performed; and
shifting the second shape variable point by the displacement, and re-performing the converting of the rectangular mask layout into the curvilinear mask layout based on the second shape variable point that has been shifted by the displacement.

2. The OPC method of claim 1, wherein the first shape variable point comprises a dissection point that is a segment dissection location, a vertex point of a plurality of vertices that each correspond to a vertex of the rectangular mask layout, and additional points on a segment between adjacent ones of the plurality of the vertices.

3. The OPC method of claim 2, wherein the rounded target pattern has a shape that is inscribed within sides of the rectangular mask layout, and
wherein the creating the second shape variable point comprises shifting the first shape variable point in a normal direction with respect to the rounded target pattern.

4. The OPC method of claim 1, wherein the shifting the second shape variable point by the displacement comprises shifting the second shape variable point without limitations on angle and distance from the rounded target pattern.

5. The OPC method of claim 1, wherein, the shifting the second shape variable point by the displacement comprises shifting the second shape variable point in a normal direction in correspondence with the rounded target pattern.

6. The OPC method of claim 1,
   wherein the initial first second shape variable point is set as the set evaluation point, and
   wherein the set evaluation point is fixed.

7. The OPC method of claim 1, wherein the converting the rectangular mask layout into the curvilinear mask layout comprises creating the curvilinear mask layout so that lines do not intersect each other while passing through a plurality of second shape variable points including the second shape variable point without generating additional points.

8. The OPC method of claim 1, wherein, the converting the rectangular mask layout into the curvilinear mask layout comprises creating the curvilinear mask layout using a Catmull-Rom spline curve method.

9. The OPC method of claim 1, wherein, when it is determined that the extracting of the contour is not to be re-performed, the curvilinear mask layout is determined as a final mask layout.

10. The OPC method of claim 1, wherein, the determining whether the extracting of the contour is to be re-performed comprises determining whether the extracting of the contour is to be re-performed according to whether the EPE is less than or equal to a set reference value or whether a number of times the extracting of the contour is performed is equal to a set reference number.

11. An optical proximity correction (OPC) method comprising:
   creating a rectangular mask layout for a target pattern on a wafer;
   creating a first shape variable point on an edge of the rectangular mask layout;
   creating a rounded target pattern inscribed within sides of the rectangular mask layout;
   creating a second shape variable point by shifting the first shape variable point on the rounded target pattern in a normal direction with respect to the rounded target pattern, and setting the second shape variable point as an evaluation point;
   converting the rectangular mask layout into a curvilinear mask layout, based on the second shape variable point;
   extracting a contour of the rounded target pattern based on the curvilinear mask layout;
   determining an edge placement error (EPE) comprising a difference between the contour and an edge of the rounded target pattern, at the evaluation point;
   determining whether to re-perform the extracting of the contour, based on a set reference value for the EPE or a set reference number of times for the extracting of the contour;
   when the extracting of the contour is to be re-performed, performing operations comprising:
      determining a displacement for the second shape variable point; and
      shifting the second shape variable point by the displacement, and re-performing the converting of the rectangular mask layout into the curvilinear mask layout based on the second shape variable point that has been shifted by the displacement, and
   when it is determined that the extracting of the contour is not to be re-performed, determining the curvilinear mask layout as a final mask layout.

12. The OPC method of claim 11, wherein the first shape variable point comprises a dissection point that is a segment dissection location, a vertex point of a plurality of vertices that each correspond to a vertex of the rectangular mask layout, and an additional point on a segment between adjacent ones of the plurality of vertices.

13. The OPC method of claim 11, wherein the shifting the second shape variable point by the displacement comprises shifting the second shape variable point without limitations on angle and distance from the rounded target pattern.

14. The OPC method of claim 11, wherein the converting the rectangular mask layout into the curvilinear mask layout comprises creating the curvilinear mask layout so that lines do not intersect each other while passing through a plurality of second shape variable points including the second shape variable point without generating additional points.

15. The OPC method of claim 11, wherein the converting the rectangular mask layout into the curvilinear mask layout comprises creating the curvilinear mask layout using a Catmull-Rom spline curve method.

16. A mask manufacturing method comprising:
   creating a rectangular mask layout for a target pattern on a wafer;
   creating a first shape variable point on an edge of the rectangular mask layout;
   creating a rounded target pattern corresponding to the target pattern;
   creating a second shape variable point by shifting the first shape variable point on the rounded target pattern, and setting the second shape variable point as an evaluation point;
   converting the rectangular mask layout into a curvilinear mask layout, based on the second shape variable point;
   extracting a contour of the rounded target pattern based on the curvilinear mask layout;
   determining an edge placement error (EPE) comprising a difference between the contour and an edge of the rounded target pattern, at the evaluation point;
   determining whether the extracting of the contour is to be re-performed;
   when the extracting of the contour is not to be re-performed, performing operations comprising:
      determining the curvilinear mask layout as an optical proximity corrected (OPCed) layout;
      transmitting data for the OPCed layout as Mask Tape-Out (MTO) design data;
      preparing a mask substrate for mask data, based on the MTO design data; and
      performing exposure on a mask substrate, based on the mask data;
   when the extracting of the contour is to be re-performed, performing operations comprising:
      determining a displacement for the second shape variable point; and
      shifting the second shape variable point by the displacement, and re-performing the converting of the rectangular mask layout into the curvilinear mask layout based on the second shape variable point that has been shifted by the displacement.

17. The mask manufacturing method of claim 16, wherein the first shape variable point comprises a dissection point that is a segment dissection location, a vertex point of a plurality of vertices that each correspond to a vertex of the rectangular mask layout, and an additional point on a segment between adjacent ones of the plurality of vertices.

18. The mask manufacturing method of claim 16, wherein, the creating the second shape variable point comprises creating the second shape variable point by shifting first shape variable points including the first shape variable point in a normal direction with respect to the rounded target pattern.

19. The mask manufacturing method of claim 16, wherein the shifting the second shape variable point by the displacement comprises shifting the second shape variable point without limitations on angle and distance from the rounded target pattern.

20. The mask manufacturing method of claim 16, wherein the curvilinear mask layout is created so that lines do not intersect each other while passing through a plurality of second shape variable points including the second shape variable point without generating additional points.

* * * * *